United States Patent
Kondo et al.

(10) Patent No.: US 11,355,693 B2
(45) Date of Patent: Jun. 7, 2022

(54) ELECTROMECHANICAL TRANSDUCER, LIQUID DISCHARGE HEAD, LIQUID DISCHARGE APPARATUS, AND METHOD FOR MANUFACTURING ELECTROMECHANICAL TRANSDUCER

(71) Applicant: RICOH COMPANY, LTD., Tokyo (JP)

(72) Inventors: Naoya Kondo, Kanagawa (JP); Satoshi Mizukami, Kanagawa (JP); Toshiaki Masuda, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 985 days.

(21) Appl. No.: 16/047,367

(22) Filed: Jul. 27, 2018

(65) Prior Publication Data
US 2019/0044055 A1 Feb. 7, 2019

(30) Foreign Application Priority Data
Aug. 1, 2017 (JP) .............................. JP2017-149293

(51) Int. Cl.
*H01L 41/187* (2006.01)
*H01L 41/09* (2006.01)
(Continued)

(52) U.S. Cl.
CPC ...... *H01L 41/1876* (2013.01); *B41J 2/14233* (2013.01); *C01G 23/003* (2013.01);
(Continued)

(58) Field of Classification Search
CPC ............ H01L 41/1876; H01L 41/0805; H01L 41/0973; H01L 41/318; H01L 41/43;
(Continued)

(56) References Cited

U.S. PATENT DOCUMENTS

2007/0097182 A1 5/2007 Kubota et al.
2013/0002767 A1* 1/2013 Mizukami ........... H01L 41/0973
347/68
(Continued)

FOREIGN PATENT DOCUMENTS

JP 2003-142659 5/2003
JP 2004-268414 9/2004
(Continued)

OTHER PUBLICATIONS

IP.com search (Year: 2022).*
Office Action dated Mar. 9, 2021 in Japanese Patent Application No. 2017-149293, 3 pages.

*Primary Examiner* — Lisa Solomon
(74) *Attorney, Agent, or Firm* — Xsensus LLP

(57) ABSTRACT

An electromechanical transducer includes an electromechanical transducer film of laminated layers including a perovskite-type complex oxide represented by a general formula of $ABO_3$; and a pair of electrodes opposed to each other with the electromechanical transducer film interposed between the pair of electrodes. In the general formula of $ABO_3$, A includes Pb and B includes Zr and Ti. A variable ratio $\Delta Pb$ of Pb, determined by Pb(max)−Pb(min), is 6% or less and a variable ratio $\Delta Zr$ of Zr, determined by Zr(max)−Zr(min), is 9% or less, where an atomic weight ratio of Pb in the electromechanical transducer film is denoted by Pb/B, an atomic weight ratio of Zr in the electromechanical transducer film is denoted by Zr/B, a maximum value and a minimum value of the atomic weight ratio of Pb in a film thickness direction of the electromechanical transducer film are denoted by Pb(max) and Pb(min), respectively, and a maximum value and a minimum value of the atomic weight ratio of Zr in the film thickness direction of the electromechanical transducer film are denoted by Zr(max) and Zr(min), respectively.

10 Claims, 7 Drawing Sheets

(51) Int. Cl.
*H01L 41/43* (2013.01)
*C01G 25/00* (2006.01)
*B41J 2/14* (2006.01)
*C01G 23/00* (2006.01)
*H01L 41/318* (2013.01)
*H01L 41/08* (2006.01)
*H01L 41/257* (2013.01)

(52) U.S. Cl.
CPC ........ *C01G 25/006* (2013.01); *H01L 41/0805* (2013.01); *H01L 41/0973* (2013.01); *H01L 41/318* (2013.01); *H01L 41/43* (2013.01); *B41J 2002/14266* (2013.01); *B41J 2202/03* (2013.01); *C01P 2002/34* (2013.01); *C01P 2002/52* (2013.01); *C01P 2006/40* (2013.01); *H01L 41/257* (2013.01)

(58) Field of Classification Search
CPC ............... H01L 41/257; B41J 2/14233; B41J 2002/14266; B41J 2202/03; C01G 23/003; C01G 25/006; C01P 2002/34; C01P 2002/52; C01P 2006/40
See application file for complete search history.

(56) References Cited

U.S. PATENT DOCUMENTS

| | | |
|---|---|---|
| 2013/0070029 A1 | 3/2013 | Mizukami et al. |
| 2013/0162726 A1 | 6/2013 | Mizukami et al. |
| 2013/0250007 A1 | 9/2013 | Ishimori et al. |
| 2013/0250009 A1 | 9/2013 | Ishimori et al. |
| 2014/0267509 A1 | 9/2014 | Shinkai et al. |
| 2015/0283811 A1 | 10/2015 | Kondo |
| 2015/0349240 A1 | 12/2015 | Mizukami |
| 2016/0099402 A1 | 4/2016 | Mizukami et al. |
| 2016/0167383 A1 | 6/2016 | Mizukami |
| 2016/0351788 A1 | 12/2016 | Mizukami |
| 2017/0144435 A1 | 5/2017 | Kondo |
| 2017/0173955 A1 | 6/2017 | Mizukami |
| 2017/0197415 A1 | 7/2017 | Shinkai et al. |
| 2017/0225461 A1 | 8/2017 | Kondo et al. |
| 2017/0253040 A1 | 9/2017 | Shinkai et al. |
| 2017/0291419 A1 | 10/2017 | Mizukami |
| 2017/0334205 A1 | 11/2017 | Mizukami |

FOREIGN PATENT DOCUMENTS

| | | |
|---|---|---|
| JP | 2004-342777 | 12/2004 |
| JP | 2005-272294 A | 10/2005 |
| JP | 2008-305821 | 12/2008 |
| JP | 2010-214800 | 9/2010 |
| JP | 2013-012655 | 1/2013 |
| JP | 2015-065430 | 4/2015 |

\* cited by examiner

ELECTROMECHANICAL TRANSDUCER, LIQUID DISCHARGE HEAD, LIQUID DISCHARGE APPARATUS, AND METHOD FOR MANUFACTURING ELECTROMECHANICAL TRANSDUCER

CROSS-REFERENCE TO RELATED APPLICATIONS

This patent application is based on and claims priority pursuant to 35 U.S.C. § 119(a) to Japanese Patent Application No. 2017-149293, filed on Aug. 1, 2017, in the Japan Patent Office, the entire disclosure of which is incorporated by reference herein.

BACKGROUND

Technical Field

Embodiments of the present disclosure relate to an electromechanical transducer, a liquid discharge head, a liquid discharge apparatus, and a method for manufacturing an electro-mechanical transducer.

Description of the Related Art

Inkjet recording apparatus and liquid discharge heads for use as an image recording apparatus or an image forming apparatus such as a printer, a facsimile, and a copying apparatus are known to have a nozzle for discharging ink droplets, and a pressurizing chamber (also referred to as an ink flow path, a pressurizing liquid chamber, a pressure chamber, a discharge chamber, or a liquid chamber) communicated with the nozzle, an electromechanical transducer for pressurizing an ink in the pressurizing chamber, or an electrothermal transducer such as a heater, or a diaphragm that forms the wall surface of the ink flow path and an energy generating means including an electrode opposed to the diaphragm. In such inkjet recording apparatuses and liquid discharge heads, the ink in the pressurizing chamber is pressurized by energy generated by the energy generating means, to discharge ink droplets from the nozzle.

The liquid discharge heads are known to use an electromechanical conversion actuator in a longitudinal vibration mode of extending and contracting in the axial direction of the electromechanical transducer, or use an electromechanical conversion actuator in a flexural vibration mode.

The liquid discharge head that uses an actuator in the flexural vibration mode is known as, for example, a head obtained by forming a uniform electromechanical transduction material layer by a film formation technique over the entire surface of the diaphragm, and cutting the electromechanical transduction material layer by a lithography method into shapes corresponding to pressure generating chambers, and thus forming electromechanical transducers so as to be independent of each pressure generating chamber.

The electromechanical transducer film is formed from a composite oxide containing lead (Pb), titanium (Ti), and zirconia (Zr) as a ferroelectric that has a perovskite structure, for example. Such a ferroelectric that has a perovskite structure has a crystal phase boundary (Morphotoropic Phase Boundary: MPB). For example, $Pb(Zr_xTi_{1-x}O_3)$ has MPB around the Zr content ratio x: 0.52, which is tetragonal at x<0.52 and rhombohedral at x>0.52. Since the dielectric constant and the piezoelectric property are extremely increased in the vicinity of the MPB, the electromechanical transducer film is formed for the Zr content ratio in the vicinity of this MPB.

As a method for such an electromechanical transducer, a lower electrode film is formed on one side of a substrate (flow path forming substrate) by a sputtering method or the like, and an electromechanical transducer film (piezoelectric layer) is then formed on the lower electrode film by a Sol-Gel method, a metal organic decomposition (MOD) method, or the like. In addition, there is a method of forming an upper electrode film on the piezoelectric layer by a sputtering method, and patterning the piezoelectric layer and the upper electrode film.

A technique is known of forming the piezoelectric layer with a predetermined thickness by repeating, more than once, a piezoelectric film forming step including a laminating step of laminating a plurality of layers of piezoelectric precursor films, and then a heating step of heating and thus crystallizing the films with a heating device.

SUMMARY

In an aspect of the present disclosure, there is provided an electromechanical transducer that includes an electromechanical transducer film of laminated layers including a perovskite-type complex oxide represented by a general formula of $ABO_3$; and a pair of electrodes opposed to each other with the electromechanical transducer film interposed between the pair of electrodes. In the general formula of $ABO_3$, A includes Pb and B includes Zr and Ti. A variable ratio ΔPb of Pb, determined by Pb(max)−Pb(min), is 6% or less and a variable ratio ΔZr of Zr, determined by Zr(max)−Zr(min), is 9% or less, where an atomic weight ratio of Pb in the electromechanical transducer film is denoted by Pb/B, an atomic weight ratio of Zr in the electromechanical transducer film is denoted by Zr/B, a maximum value and a minimum value of the atomic weight ratio of Pb in a film thickness direction of the electromechanical transducer film are denoted by Pb(max) and Pb(min), respectively, and a maximum value and a minimum value of the atomic weight ratio of Zr in the film thickness direction of the electromechanical transducer film are denoted by Zr(max) and Zr(min), respectively.

In another aspect of the present disclosure, there is provided a method for manufacturing an electromechanical transducer that includes an electromechanical transducer film of laminated layers including a perovskite-type complex oxide represented by a general formula of $ABO_3$; and a pair of electrodes opposed to each other with the electromechanical transducer film interposed between the pair of electrodes. In the general formula of $ABO_3$, A includes Pb and B includes Zr and Ti. The method includes first applying and firing a first precursor solution including Pb, Zr, and Ti; second applying and firing a second precursor solution including Pb, Zr, and Ti; third applying and firing a third precursor solution including Pb, Zr, and Ti; sintering a film obtained by the first applying and firing, the second applying and firing, and the third applying and firing; and repeating the first applying and firing, the second applying and firing, the third applying and firing, and the sintering a predetermined number of times, to form an electromechanical transducer film. In an order of the first precursor solution, the second precursor solution, and the third precursor solution, a concentration of Zr decreases and a concentration of Ti increases. When a concentration of Pb in a precursor solution is denoted by Pb/B, the concentration of Pb in each of the first precursor solution, the second precursor solution, and the third precursor solution is from 100% to 120%. When a concentration of Zr in a precursor solution is denoted by Zr/B, a ratio of the concentration of Zr between precursor solutions for adjacent films is 0.8 or more and less than 1.

BRIEF DESCRIPTION OF THE SEVERAL VIEWS OF THE DRAWINGS

The aforementioned and other aspects, features, and advantages of the present disclosure would be better understood by reference to the following detailed description when considered in connection with the accompanying drawings, wherein.

Figure 1:
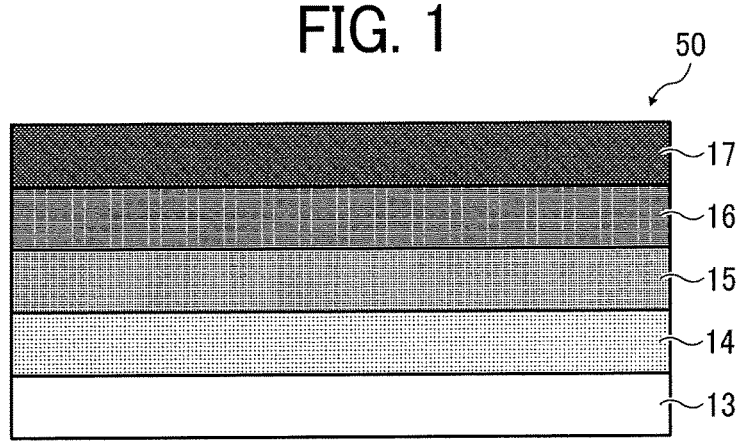
FIG. 1 is a schematic diagram showing an example of a configuration of an electromechanical transducer.

The accompanying drawings are intended to depict embodiments of the present disclosure and should not be interpreted to limit the scope thereof. The accompanying drawings are not to be considered as drawn to scale unless explicitly noted.

DETAILED DESCRIPTION

In describing embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner and achieve similar results.

Although the embodiments are described with technical limitations with reference to the attached drawings, such description is not intended to limit the scope of the disclosure and all of the components or elements described in the embodiments of this disclosure are not necessarily indispensable.

Referring now to the drawings, embodiments of the present disclosure are described below. In the drawings for explaining the following embodiments, the same reference codes are allocated to elements (members or components) having the same function or shape and redundant descriptions thereof are omitted below.

Hereinafter, an electromechanical transducer, a liquid discharge head, a liquid discharge apparatus, and a method for manufacturing an electromechanical transducer according to an embodiment of the present disclosure will be described with reference to the drawings. It is to be noted that the present invention is not to be considered limited to the following embodiments, but can be changed within the range that can be conceived of by those skilled in the art, such as other embodiments, additions, modifications, deletions, and the scope of the present invention encompasses therein any aspect, as long as the aspect achieve the operation and advantageous effect of the present invention.

An electromechanical transducer according to an embodiment of the present disclosure includes an electromechanical transducer film obtained by laminating layers including a perovskite-type complex oxide represented by the following general formula (1), and a pair of electrodes disposed to sandwich the electromechanical transducer film, where when the atomic weight ratio [%] of Pb included in the electromechanical transducer film is denoted by Pb/B, whereas the atomic weight ratio [%] of Zr included in the electromechanical transducer film is denoted by Zr/B, and when the maximum value and minimum value of the atomic weight ratio of Pb in the film thickness direction of the electromechanical transducer film are respectively denoted by Pb(max) and Pb(min), whereas the maximum value and minimum value of the atomic weight ratio of Zr are respectively denoted by Zr(max) and Zr(min), the variable ratio ΔPb of Pb, determined by Pb(max)–Pb(min), is 6% or less, and the variable ratio ΔZr of Zr, determined by Zr(max)–Zr(min) is 9% or less.

ABO$_3$                    General Formula (1)

(in the general formula (1), the A contains Pb and the B contains Zr and Ti.)

The B may contain one or more elements selected from Sn, Ni, Zn, Mg, Mn, and Nb as optional constituents.

The above-mentioned electromechanical transducer according to an embodiment of the present disclosure will be described in detail with reference to the drawings.

Figure 2A:
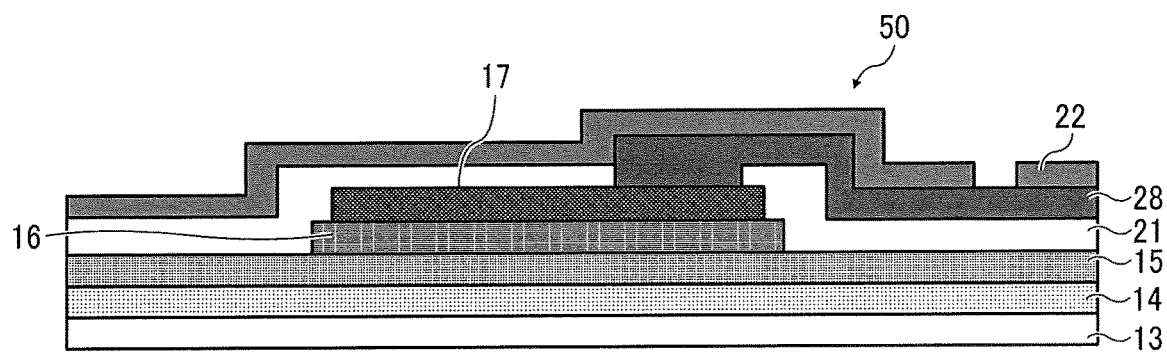
FIGS. 2A and 2B are a schematic cross-sectional view and a schematic plan view that show another example of the configuration of the electromechanical transducer.
Figure 2B:
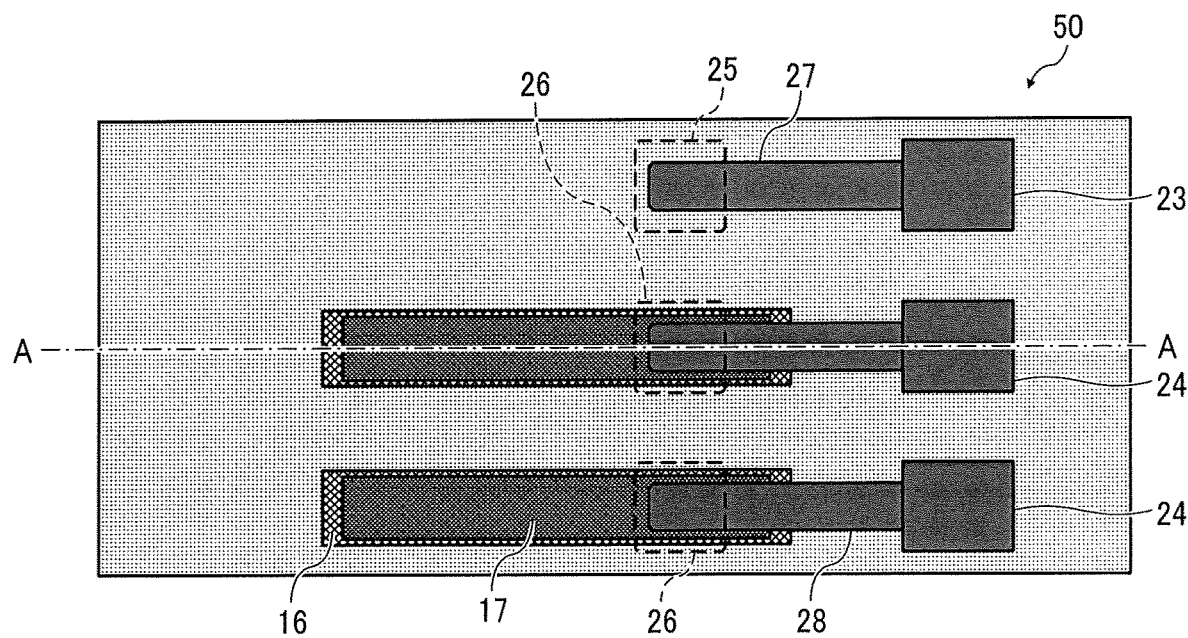

First, an example of the configuration of an electromechanical transducer 50 (also referred to as a piezoelectric element) will be described with reference to FIG. 1. FIG. 1 shows an example of the electromechanical transducer 50 including a substrate 13, a film-formation vibration plate 14 (also referred to as a diaphragm or the like), a first electrode 15, an electromechanical transducer film 16, and a second electrode 17. FIGS. 2A and 2B show a configuration example including an insulating protective film and a leading wire. FIG. 2A is a schematic view of a cross section along the line A-A in FIG. 2B.

A first insulating protective film 21 has contact holes 25 and 26, and a common electrode leading wire (third electrode 27) extends to the first electrode 15, whereas an individual electrode leading wire (fourth electrode 28) extends to the second electrode 17. In this regard, the second insulating protective film 22 for protecting the common/individual electrode lead-out wiring is formed using the first electrode 15 as a common electrode and the second electrode 17 as an individual electrode. As shown in FIG. 2B, a common electrode PAD 23 and an individual electrode PAD 24 are formed which are partially open. It is to be noted that the insulating protective film is omitted in FIG. 2B.

In addition, the first electrode 15 refers to a lower electrode, whereas the second electrode refers to an upper electrode, which may be also referred to respectively as a common electrode and an individual electrode. The lower electrode and the upper electrode may interchangeably serve as a common electrode and an individual electrode, and the form of the element may be changed depending on the purpose of the electrodes.

According to the present embodiment, a fifth electrode and a sixth electrode, not shown, are formed, and the first electrode and the second electrode can be electrically connected to the fifth electrode, whereas the third electrode and the fourth electrode can be electrically connected to the sixth electrode. In this regard, the fifth electrode is configured as a common electrode, whereas the sixth electrode is configured as an individual electrode.

Figure 3A:
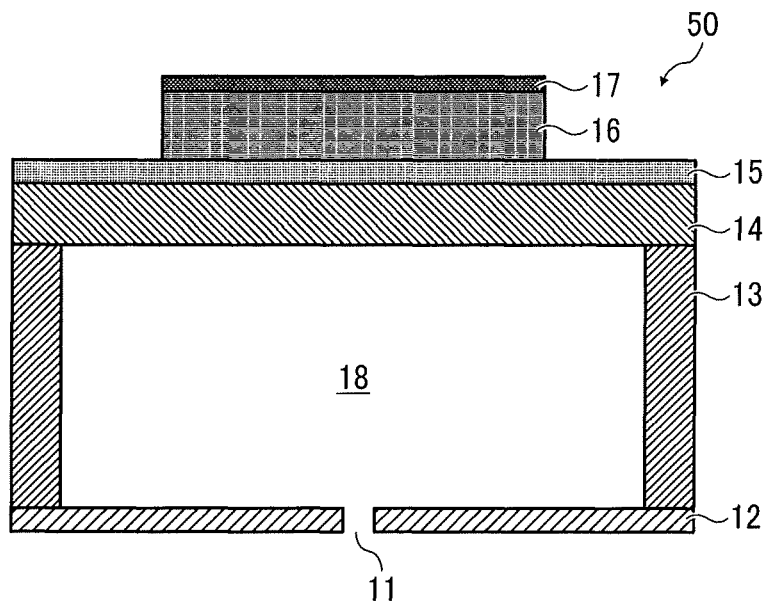
FIGS. 3A and 3B are a schematic view illustrating an example of a configuration of a liquid discharge head and a schematic view illustrating another example of a configuration of the liquid discharge head.
Figure 3B:
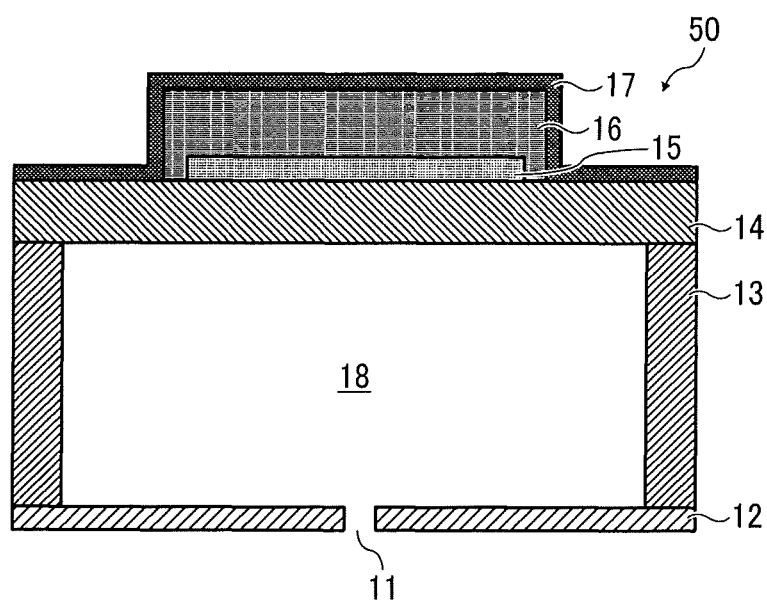

FIGS. 3A and 3B show examples of a liquid discharge head including the electromechanical transducer 50 mentioned above. FIG. 3A is a schematic cross-sectional view in a case where the lower electrode serves as a common electrode, whereas the upper electrode serves as an individual electrode, and FIG. 3B is a schematic cross-sectional view in a case where the lower electrode serves as an individual electrode, whereas the upper electrode serves as an individual electrode.

The method for fabricating the electromechanical transducer according to the present embodiment can be changed appropriately. For example, examples of the method include after forming a film-formation vibration plate, a lower electrode, an electromechanical transducer film, and an upper electrode on a substrate, etching the upper electrode, the electromechanical transducer film, and the lower electrode into a desired shape, and forming insulating protective films, to form a pressure chamber 18 (also referred to as a pressurizing chamber, a liquid chamber, or the like). Besides, it is possible to make appropriate changes such as etching the lower electrode into a desired shape, and then forming an electromechanical transducer film.

Figure 4A:
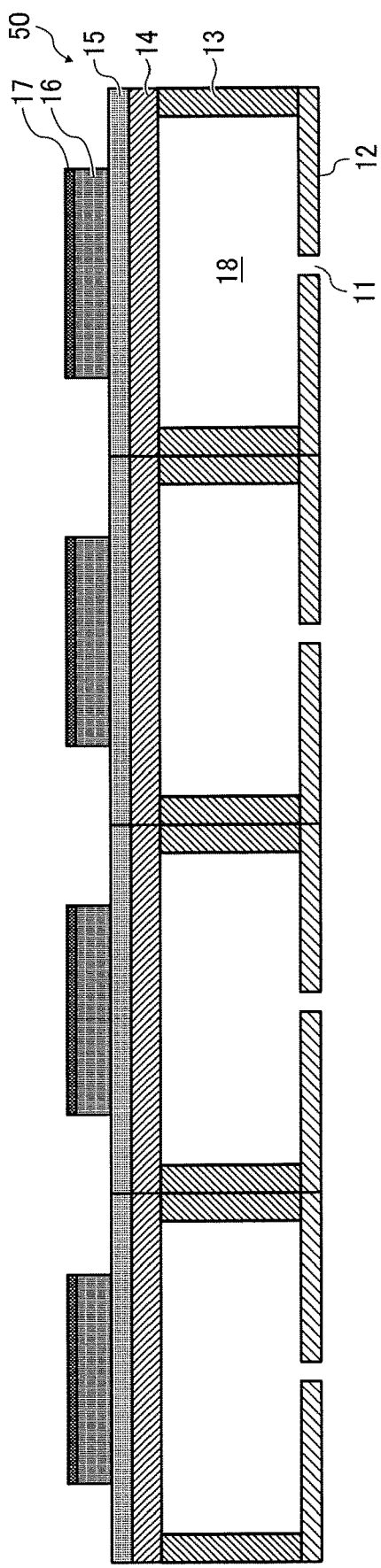
FIGS. 4A and 4B are a schematic view illustrating an example of a configuration of a liquid discharge head including a plurality of electromechanical transduction elements and a schematic view illustrating another example of a configuration of the liquid discharge head.
Figure 4B:
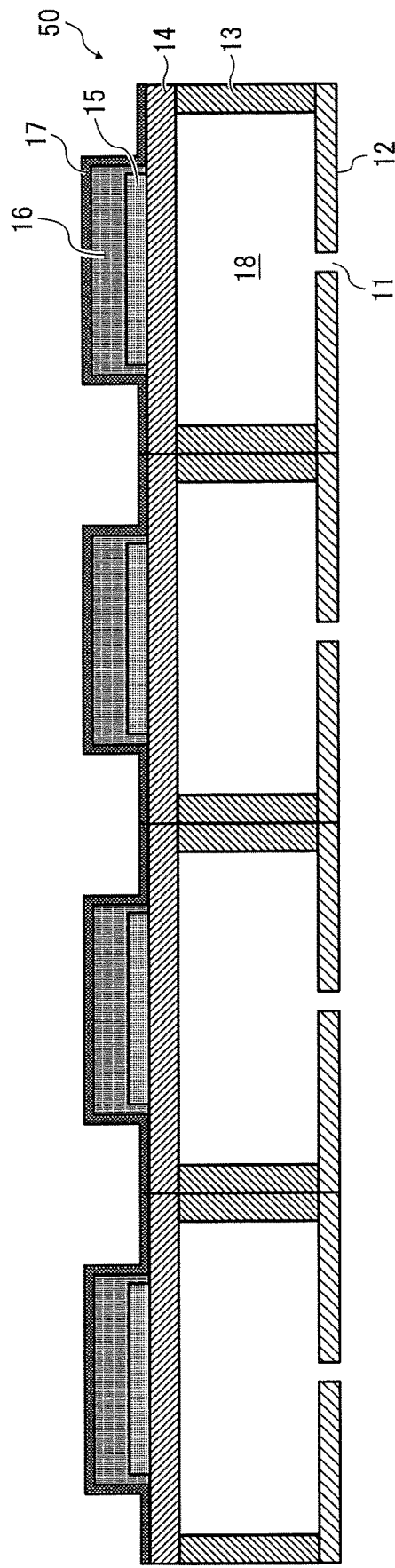

In addition, FIGS. 4A and 4B show examples of a plurality of liquid discharge heads arranged. According to the present embodiment, a liquid discharge head can be obtained which has various properties such as discharge properties improved. The liquid discharge head can be fabricated by a method such as after the formation of the electromechanical transducer, etching for removal from the back surface for the formation of a pressure chamber, and joining a nozzle plate 12 with a nozzle hole 11. In the figure, the illustration of a liquid supply means, a flow path, and a fluid resistance is omitted.

In order to ensure discharging performance at high frequencies, it is preferable to increase the rigidity of the diaphragm, the electromechanical transducer film, and the insulating protective film, which preferably have a high Young's modulus, and have a film thickness increased. In particular, the diaphragm is, in consideration of stress design, preferably formed from a plurality of layers made of $SiO_2$, SiN, and Poly-Si, preferably 1 μm or more and 3 μm or less in film thickness, and furthermore, preferably 75 GPa or more and 95 GPa or less in Young's modulus. In this case, discharging performance at high frequencies is ensured more easily.

<Substrate>

As the substrate, it is preferable to use a silicon single-crystalline substrate, and it is preferable to have a thickness of 100 to 600 μm. As the plane orientation, three types of plane orientations: (100), (110), and (111) can be used, and plane orientations of (100) and (111) are typically used, and according to the present embodiment, a single-crystalline substrate with a plane orientation of (100) is preferred.

In addition, in the case of fabricating the pressure chamber 18, a silicon single-crystalline substrate is processed through the use of etching, and as an etching method in this case, anisotropic etching is typically used. Anisotropic etching utilizes the property that the etching rate varies with respect to the plane orientation of the crystal structure. For example, in anisotropic etching of immersion in an alkaline solution such as KOH, the (111) plane has an etching rate of about 1/400 as compared with the (100) plane. Accordingly, a structure with an inclination of about 54° can be fabricated with the plane orientation (100), whereas a deep groove can be cut with the plane orientation (110), and the array density can be thus increased while maintaining more rigidity.

According to the present embodiment, it is also possible to use a single-crystalline substrate with a plane orientation of (110), but in this case, it is to be noted that $SiO_2$ which can be used as a mask material is also etched.

In addition, the width of the pressure chamber can be changed appropriately, but is preferably 50 μm or more and 70 μm or less. When the width is larger than this value, the residual vibration may be increased in some cases, to make it more difficult to ensure discharging performance at high frequencies. When the width is smaller than this value, the amount of displacement may be decreased in some cases, to make it more difficult to ensure an adequate discharge voltage.

<Diaphragm>

As the diaphragm, the diaphragm (base film) is deformed and displaced in response to the force generated by the electromechanical transducer film, to discharge ink droplets (sometimes referred to as a liquid) in the pressure chamber. Therefore, the base film preferably has predetermined strength.

Examples of the material for the diaphragm include, for example, Si, $SiO_2$, and $Si_3N_4$ prepared by a chemical vapor deposition (CVD) method.

Furthermore, it is preferable to select a material close in linear expansion coefficient to the first electrode 15 and the electromechanical transducer film 16. In particular, since PZT (lead zirconate titanate) is often typically used as a material for the electromechanical transducer film, a material is preferable which has a linear expansion coefficient of $5 \times 10^{-6}$ to $10 \times 10^{-6}$ as a linear expansion coefficient close to $8 \times 10^{-6}$ [1/K], and a material is more preferable which has a linear expansion coefficient of $7 \times 10^{-6}$ to $9 \times 10^{-6}$.

Specific examples include aluminum oxide, zirconium oxide, iridium oxide, ruthenium oxide, tantalum oxide, hafnium oxide, osmium oxide, rhenium oxide, rhodium oxide, palladium oxide, and compounds thereof, which can be prepared with a spin coater by using a sputtering method or a Sol-gel method.

The film thickness is preferably 1 to 3 μm, and more preferably 1.5 to 2.5 μm. When the film thickness is smaller than this range, it may be difficult to process the pressure chamber, whereas when the film thickness is larger than this range, it may be more difficult to deform and displace the base film, to make discharge of ink droplets unstable.

As described above, in order to ensure discharging performance at high frequencies, the diaphragm is preferably formed from a plurality of layers made of $SiO_2$, SiN, and Poly-Si, and preferably thickness of 1 μm or more and 3 μm or less in film thickness. Furthermore, the Young's modulus is preferably 75 GPa or more and 95 GPa or less. In the case mentioned above, discharging performance at high frequencies is ensured more easily.

<First Electrode, Second Electrode>

As the first electrode and the second electrode, platinum with high heat resistance and low reactivity has been conventionally used as a metal material. On the other hand, in some cases, the platinum may be considered to have insufficient barrier properties against lead, and examples of the electrodes include platinum group elements such as iridium and platinum-rhodium and alloy films of the platinum group elements.

In the case of using platinum, it is preferable to laminate Ti, $TiO_2$, Ta, $Ta_2O_5$, $Ta_3N_5$, or the like first in consideration of the adhesion to the base (in particular, $SiO_2$).

Methods for the electrode preparation include, for example, vacuum film formation such as a sputtering method or vacuum vapor deposition.

The film thickness is preferably 0.05 to 1 μm, and more preferably 0.1 to 0.5 μm.

Furthermore, an oxidation electrode film such as a material of $SrRuO_3$ or $LaNiO_3$ may be used between the metal material mentioned above and the electromechanical transducer film. In particular, for the oxide electrode between the first electrode and the electromechanical transducer film, the material selected also depends on the orientation to which preference is desirably given, because the oxide electrode also affects the orientation control of the electromechanical transducer film (for example, PZT film) to be formed on the oxide electrode.

According to the present embodiment, it is preferable to give preference to the PZT (100) orientation, and thus, as the second electrode, a seed layer such as $LaNiO_3$ or $TiO_2$ seed or $PbTiO_3$ is formed on the first electrode, and a PZT film is then formed.

For example, $SrRuO_3$ can be used as the oxidation electrode film between the second electrode and the electromechanical transducer film. The film thickness of the oxidation electrode film is preferably from 20 nm to 80 nm, and more preferably from 30 nm to 50 nm. When the film is thinner than this film thickness range, inadequate characteristics may be obtained for initial displacement and displacement deterioration characteristics. When the thickness exceeds this range, the withstand voltage of the PZT film formed thereafter may be degraded, and the current leakage may be increased.

<Electromechanical Transduction Film>

As the electromechanical transducer film, PZT is preferably used. PZT is a solid solution of lead zirconate ($PbZrO_3$) and lead titanate ($PbTiO_3$), and depending on the ratio between the lead zirconate and the titanic acid, the PZT differs in property. The composition which typically shows an excellent piezoelectric property has a ratio of 53:47 between $PbZrO_3$ and $PbTiO_3$, which is represented by a chemical formula $Pb(Zr_{0.53},Ti_{0.47})O_3$, generally PZT (53/47). Examples of complex oxides other than PZT include barium titanate.

In the case where preference is given to the PZT (100) plane orientation, the composition ratio between Zr and Ti is preferably 0.45 or more and 0.55 or less, and more preferably 0.48 or more and 0.52 or less in terms of Ti/(Zr+Ti).

According to the present embodiment, it is preferable to give preference to PZT (100) orientation, and the crystal orientation is expressed as follows.

$\rho(hkl) = I(hkl)/\Sigma I(hkl)$ $\rho(hkl)$: degree of orientation of (hkl) plane orientation $I(hkl)$: peak intensity of arbitrary orientation $\Sigma I(hkl)$: sum of respective peak intensities The degree of orientation of (100) orientation, which is calculated on the basis of the ratio of the peak intensity for each orientation when the thus expressed sum of the respective peak intensities obtained by θ-2θ measurement in accordance with an X-ray diffraction method is regarded as 1, is preferably 0.75 or more, and more preferably 0.85 or more. When the degree of orientation is less than 0.75, piezoelectric strain may be obtained insufficiently, and the amount of displacement may be ensured insufficiently.

These materials are described by the general formula $ABO_3$, which correspond to complex oxides containing A=Pb, Ba, or Sr, and B=Ti, Zr, Sn, Ni, Zn, Mg, Mn, or Nb as main constituents. Examples of these materials include $(Pb_{1-x},Ba_x)(Zr,Ti)O_3$ and $(Pb_{1-x},Sr_x)(Zr,Ti)O_3$, which are examples where Pb at the A site partially substituted with Ba or Sr. Such substitution is possible with any divalent element, which has the effect of acting to compensate for characteristic degradation due to evaporation of lead during heat treatment.

Examples of a method for preparing the electromechanical transducer film include, for example, preparing the film with a spin coater or the like by using a sputtering method or a Sol-Gel method. In that case, since patterning is required, a desired pattern is obtained by photolithography etching or the like.

In the case of preparing PZT by the Sol-Gel method, a lead acetate, zirconium alkoxide, titanium alkoxide compound are adopted as starting materials, dissolved in methoxyethanol as a common solvent, and a homogeneous solution is obtained, to allow for the preparation of a PZT precursor solution. Since a metal alkoxide compound is readily hydrolyzed by moisture in the atmosphere, an appropriate amount of stabilizing agent such as acetylacetone, acetic acid, or diethanolamine may be added as a stabilizer to the precursor solution.

In addition, in the case of obtaining a PZT film over the entire surface of the base substrate, a coating film is formed by a solution coating method such as spin coating, and subjected to each heat treatment of solvent drying, thermal decomposition, and crystallization, to provide the film. The transformation from the coating film to the crystallized film involves volumetric shrinkage, and thus, in order to obtain a crack-free film, it is preferable to adjust the precursor concentration so that a film thickness of 100 nm or less is obtained in a single step.

The film thickness of the electromechanical transducer film is preferably 1 to 10 μm, more preferably 1 to 3 μm, and still more preferably 1.5 to 2.5 μm. When the film thickness is smaller than this range, it may be difficult to process the pressure chamber, whereas when the film thickness is larger than this range, it may be more difficult to deform and displace the base film, to make discharge of ink droplets unstable.

Next, the composition variation in the electromechanical transducer film will be described in detail.

Examples of the method for preparing the electromechanical transducer film include a film formation method of repeating a step of applying a precursor solution containing Pb, Zr, and Ti, and a sintering step involving crystallization more than once. In such a production process, $PbTiO_3$ that has low crystallization energy and a low firing temperature is formed first, Zr is then taken in, and a solid solution is provided, to result in $Pb(Zr,Ti)O_3$ of target composition.

However, in accordance with the conventional technique, the composition often varies in the process of growth. When the solid solution is not produced as intended in the process of crystallization, a lower portion of the film is crystallized as Ti-rich Pb(Zr,Ti)O$_3$ derived from PbTiO$_3$ which starts to be crystallized, and an upper portion of the film is crystallized as Zr-rich Pb(Zr,Ti)O$_3$. As a result, Zr and Ti vary in the film thickness direction. In addition, Pb also varies due to volatilization during crystallization, or the like.

On the other hand, according to the present embodiment, the composition variations of Pb, Zr, and Ti in the film thickness direction of the electromechanical transducer film are suppressed, to make it possible to reduce the occurrence of failures, with favorable piezoelectric property and withstand voltage. Thus, discharging characteristics are further improved, and furthermore, stable discharging characteristics can be maintained even in the case of continuous discharging.

According to the present embodiment, the electromechanical transducer film obtained by laminating a layer made of a perovskite-type composite oxide represented by the following general formula (1) is provided, and prepared as follows. The process of: repeating a step of applying and firing a precursor solution containing at least Pb, Zr, and Ti more than once; and then providing the solution further sintered is repeated as one cycle until obtaining a predetermined film thickness, to prepare the electromechanical transducer film.

$$ABO_3 \qquad \text{General Formula (1)}$$

(in the general formula (1), the A contains Pb and the B contains Zr and Ti.)

The B may contain one or more elements selected from Sn, Ni, Zn, Mg, Mn, and Nb as optional constituents.

For the electromechanical transducer film thus obtained, the ratios by atomic weight (also referred to as composition ratios) of Pb, Zr, and Ti are determined by calculating the composition ratios with the B site element as a denominator. The atomic weight ratio [%] of Pb included in the electromechanical transducer film is defined as Pb/B, whereas the atomic weight ratio [%] of Zr in the electromechanical transducer film is defined as Zr/B, for the calculation of the composition ratios.

It is to be noted that when Pb is used as A in the general formula ABO$_3$, whereas only Zr and Ti are used as B, the ratios by atomic weight of Pb, Zr, and Ti are respectively expressed as Pb/(Zr+Ti), Zr/(Zr+Ti), Ti/(Zr+Ti).

In the case of an electromechanical transducer film including a plurality of layers, it is important to consider the composition ratios in the film thickness direction, and the following values are calculated.

The maximum value and maximum value of the atomic weight ratio of Pb in the film thickness direction of the electromechanical transducer film are respectively denoted by Pb(max) and Pb(min), and the maximum value and minimum value of the atomic weight ratio of Zr are respectively denoted by Zr(max) and Zr(min).

In this regard, the variable ratio ΔPb of Pb in the film thickness direction of the electromechanical transducer film can be expressed as Pb(max)−Pb(min), and the variable ratio ΔZr of Zr in the direction can be expressed as Zr(max)−Zr(min).

The composition ratio of Pb is likely to vary due to volatilization during firing, or the like. In addition, Pb diffuses in the vertical direction of the film, including Pb and the like remaining at the interface and the like in the film, which also causes the composition ratio to vary.

On the other hand, the composition ratio of Zr varies mainly due to the difference in crystallization temperature between PbTiO$_3$ and PbZrO$_3$. PbTiO$_3$ with a low crystallization temperature starts to be crystallized first, and Zr is taken into the crystallized PbTiO$_3$, to provide a solid solution as PZT. However, when the solid solution is not produced sufficiently in the process of crystallization, a lower portion of the film is crystallized as Ti-rich Pb(Zr,Ti)O$_3$ derived from PbTiO$_3$ which starts to be crystallized, whereas an upper portion of the film is crystalized as Zr-rich Pb(Zr,Ti)O$_3$, to result in variations in Zr and Ti in the film thickness direction.

According to the present embodiment, the variable ratio ΔPb of Pb and the variable ratio ΔZr of Zr in the film thickness direction of the electromechanical transducer film are respectively adjusted to 6% or less and 9% or less, to make it possible to obtain a favorable piezoelectric property while ensuring an adequate withstand voltage. In addition, this adjustment can reduce element failures, and maintain stable continuous driving.

In addition, when the average value for the atomic weight ratio [%] of Zr in the film thickness direction of the electromechanical transducer film is denoted by Zr(ave), Zr(ave) is preferably from 40% to 70%, and more preferably from 50% to 60%. Outside this range, favorable electromechanical transduction characteristics are made less likely to be achieved, and the amount of displacement may be decreased. In addition, the characteristics are made more likely to vary between before and after continuous operation.

In addition, when the average value for the atomic weight ratio [%] of Pb in the film thickness direction of the electromechanical transducer film is denoted by Pb(ave), Pb(ave) is preferably from 100% to 109%. In this case, the withstand voltage can be further improved. On the other hand, when Pb(ave) falls outside the range mentioned, the withstand voltage may be decreased, and the current leakage may be increased.

The atomic weight ratio in the film thickness direction of the electromechanical transducer film can be measured with the use of inductively coupled plasma (ICP) emission spectrometry and transmission electron microscopy-energy dispersive X-ray spectroscopy (TEM-EDS).

Figure 5:
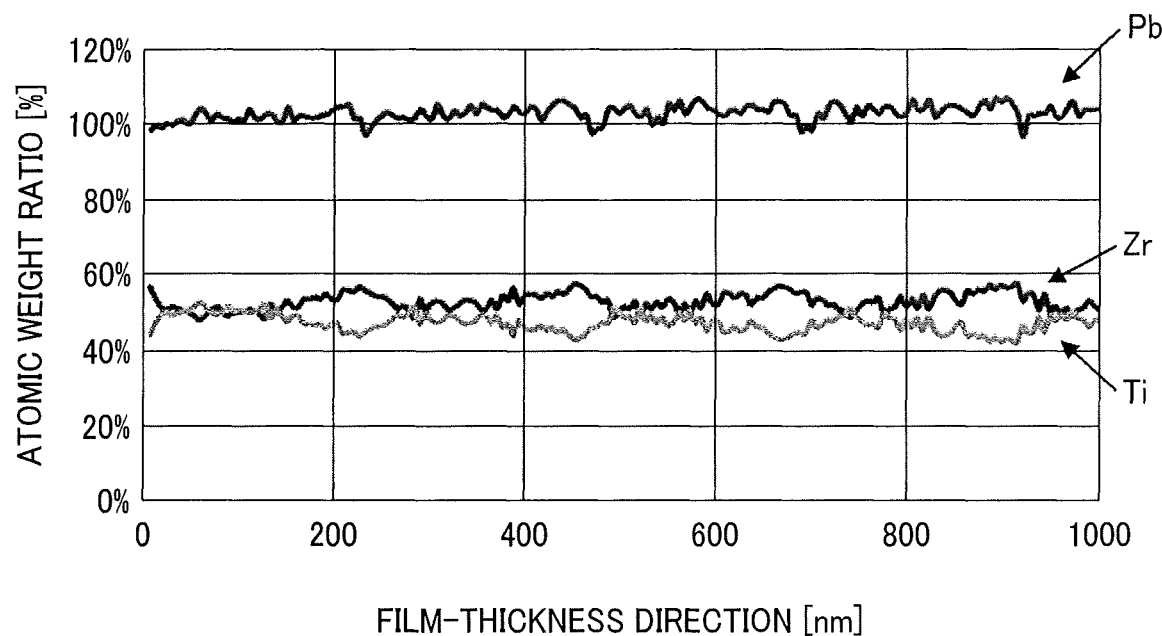
FIG. 5 is a graph for explaining an example of a composition distribution in the film thickness direction of an electromechanical transducer film.

FIG. 5 shows an example of the composition distribution in the film thickness direction in the case of measurement by TEM-EDS for the electromechanical transducer film according to the present embodiment. The horizontal axis has an arbitrary scale, which shows the film thickness of the electromechanical transducer film when the first electrode side is regarded as the origin. The vertical axis indicates respective ratios by atomic weight, determined from the signal intensity derived from each element in accordance with TEM-EDS.

As shown in FIG. 5, Pb, Zr, and Ti each vary in composition ratio, the variable ratio ΔPb is 6% or less, and the variable ratio ΔZr is 9% or less.

Figure 6:
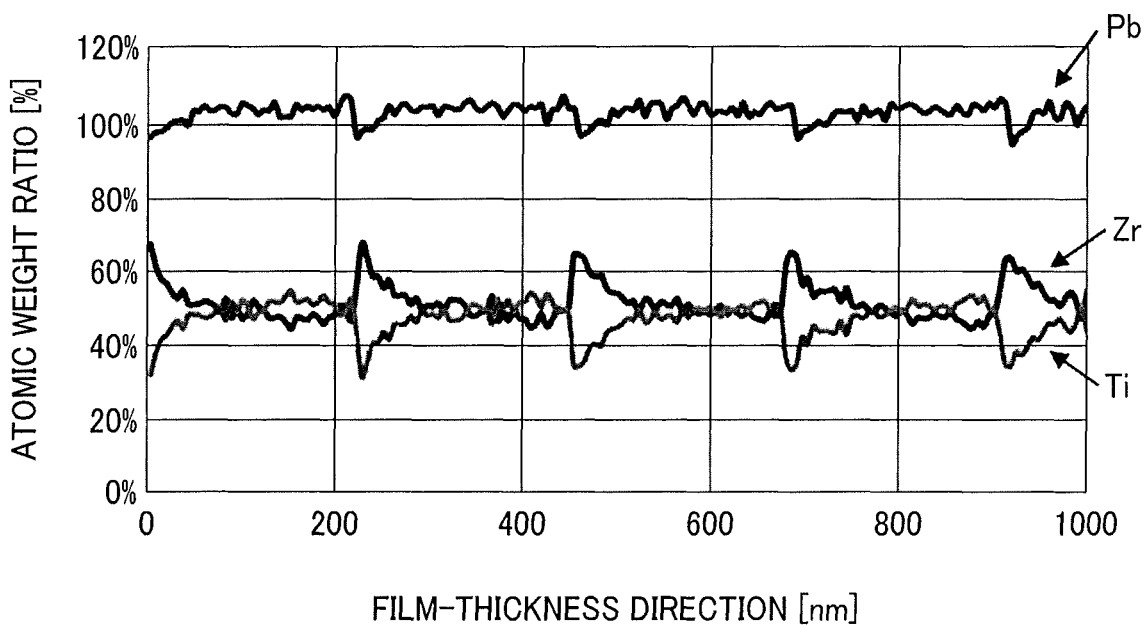
FIG. 6 is a graph for explaining another example of a composition distribution in the film thickness direction of an electromechanical transducer film.

On the other hand, FIG. 6 shows an example of the composition distribution in the film thickness direction in the case of measurement by TEM-EDS for an electromechanical transducer film outside the present embodiment. Pb, Zr, and Ti each vary in composition ratio, and in particular, Zr and Ti vary significantly. As shown in FIG. 6, the variable ratio ΔPb and the variable ratio ΔZr both fall outside the desired ranges according to the present embodiment.

According to the present embodiment, the ratios by atomic weight of Pb, Zr, and Ti in the electromechanical transducer film periodically varies with respect to the film thickness direction of the electromechanical transducer film.

In the preparation of the electromechanical transducer film from a plurality of layers, an electromechanical transducer film which varies periodically is obtained by adjusting the film thickness of each layer and the composition ratio of the precursor solution for forming each layer. In addition, in order to determine that the composition ratio varies, depending on the detection resolution of the analyzer, for example, a case is cited in which when the variable ratio $\Delta Pb$ of Pb is 3% or more, the variable ratio $\Delta Zr$ of Zr is 3% or more. In addition, when a variation period is confirmed, the composition ratio can be considered to vary periodically.

When the ratios by atomic weight of Pb, Zr, and Ti in the electromechanical transducer film vary periodically with respect to the film thickness direction, the variation periods are preferably 100 to 400 nm. In this case, it is easy to adjust the variable ratio $\Delta Pb$ of Pb and the variable ratio $\Delta Zr$ of Zr within desired ranges.

Next, a method for manufacturing the electromechanical transducer film according to the present embodiment will be described. The present embodiment provides an example in which three precursor solutions containing Pb, Zr, and Ti are used, but the present invention is not to be considered limited to this.

According to the present embodiment, the method includes a first applying and firing step of applying and firing a first precursor solution, a second applying and firing step of applying and firing a second precursor solution, a third applying and firing step of applying and firing a third precursor solution, and a sintering step of carrying out sintering of the film obtained by the first applying and firing step to the third applying and firing step.

Then, the first to third applying and firing steps and the sintering step are repeated more than once until reaching a desired film thickness, to form an electromechanical transducer film.

According to the present embodiment, in order to suppress the composition variation in the film thickness direction, the Zr concentration is decreased, whereas the Ti concentration is increased, in the order of the first precursor solution, the second precursor solution, and the third precursor solution. As described above, the difference in crystallization temperature between $PbTiO_3$ and $PbZrO_3$ and the like are taken into consideration.

On the other hand, even if the precursor solutions are adapted to prepare an electromechanical transducer film as described above, the variable ratio $\Delta Pb$ of Pb and the variable ratio $\Delta Zr$ of Zr may fail to fall within the desired ranges according to the present embodiment. In order to cause the variable ratio $\Delta Pb$ of Pb and the variable ratio $\Delta Zr$ of Zr to fall within desired ranges, the composition ratios of the precursor solutions are adjusted as follows, for example.

When the concentration [%] of Pb in the precursor solution is denoted by Pb/B, the concentration of Pb in each of the first precursor solution, the second precursor solution, and the third precursor solution is from 100% to 120%, and more preferably from 110% to 120%.

In addition, when the concentration [%] of Zr in the precursor solution is denoted by Zr/B, the ratio the concentration of Zr between the precursor solutions for adjacent films is preferably 0.8 or more and less than 1.

For example, when the first precursor solution is compared with the second precursor solution, the concentration [%] of Zr in the first precursor solution is determined as Zr/B, which is defined as Zr1 for convenience sake, and the concentration [%] of Zr in the second precursor solution is determined as Zr/B, which is defined as Zr2 for convenience sake. In this regard, Zr2/Zr1 satisfies 0.8 or more and less than 1. In addition, in the same manner as for the second precursor solution and the third precursor solution, Zr3/Zr2 meets 0.8 or more and less than 1.

In the range of less than 0.8, the difference in composition between adjacent films at the stage of the precursor solutions is increased, to insufficiently proceed with the production of a solid solution during firing. In addition, when the difference in composition is excessively large, there is a new need for a higher temperature for a longer time for firing, to narrow the process windows, and thus resulting in a significant disadvantage due to the adjustment of the precursor solutions.

The ratio between the concentrations of Zr in the precursor solutions for the adjacent films is more preferably 0.9 or more. In this case, the piezoelectric property and the withstand voltage can be made favorable.

It is to be noted that the term "adjacent films" mean adjacent films formed by film formation before carrying out the sintering step, and the first precursor solution and the third precursor solution are not taken into consideration.

In addition, when the concentration [%] of Zr in the precursor solution is denoted by Zr/B, the concentration [%] of Zr is preferably from 45% to 65%. In this case, the piezoelectric property and the withstand voltage can be made favorable.

The adjustment of the precursor solutions as mentioned above makes it easy to adjust the variable ratio $\Delta Pb$ of Pb and the variable ratio $\Delta Zr$ of Zr to desired ranges.

<Third Electrode, Fourth Electrode, Electrode Pad>

The materials of the third electrode 27, the fourth electrode 28 (these are sometimes referred to as leading wires), and the electrode pads 23 and 24 are preferably metal electrode materials including any one of an Ag alloy, Cu, Al, Au, Pt, and Ir. As a method for preparing these electrodes, a sputtering method or a spin coating method is used for the preparation, and a desired pattern is then obtained by photolithographic etching or the like.

The film thickness is preferably 0.1 to 20 µm, and more preferably 0.2 to 10 µm. When the thickness is less than 0.1 µm, the resistance is increased, to fail to apply a sufficient electric current to the electrodes, and head discharging may be thus unstable in some cases. On the other hand, when the thickness is larger than 20 µm, the process time may be prolonged.

In addition, the contact resistances at the contact holes 25 and 26 (for example, 10 µm) coupled to the common electrode and the individual electrode are preferably 10Ω or less as the common electrode and 1Ω or less as the individual electrode. More preferably, the resistances are 5Ω or less as the common electrode and 0.5Ω or less as the individual electrode. If the resistances exceed the foregoing ranges, a sufficient electric current fails to be supplied, and trouble may be caused in discharging liquid droplets.

In addition, the area of the electrode pad part is preferably 50×50 µm$^2$ or more, and more preferably 100×300 µm$^2$ or more. When this value is not satisfied, sufficient polarization treatment may fail to be carried out, and trouble may be caused, such as inability to obtain satisfactory characteristics regarding displacement deterioration after continuous driving.

<First Insulating Protective Film>

Next, the first insulating protective film laminated on the first electrode will be described.

The first insulating protective film is preferably a dense inorganic material because it is necessary to prevent damage to the electromechanical transducer due to the film formation/etching step and select a material which is unlikely to exhibit permeation of moisture in the atmosphere. In order to achieve sufficient protection performance with an organic material, it is necessary to increase the film thickness of the organic material, which is not preferable in some cases.

When the film thickness of the first insulating protective film is increased, the vibration displacement of the base film is remarkably hindered, thus resulting in a liquid discharging head which has low discharging performance in some cases.

In order to achieve high protection performance while reducing the film thickness of the first insulating protective film, it is preferable to use an oxide, a nitride, or a carbide, and it is preferable to select a material which has high adhesion to the electrode material, the piezoelectric material, and the base film material which serve as a base for the first insulating protective film.

As for the film formation method, it is preferable to select a film forming method that causes no damage to the electromechanical transducer. More specifically, it is not preferable to adopt a plasma CVD method of turning a reactive gas into plasma for deposition on a substrate, or a sputtering method of causing plasma to collide with a target material and sputtering the material for film formation. Examples of preferred film formation methods can include, a vapor deposition method, an atomic layer deposition (ALD) method, but an ALD method is preferred which has a wide choice of materials that can be used.

Examples of a preferred material that is used for the first insulating protective film include an oxide film that is used for a ceramic material such as $Al_2O_3$, $ZrO_2$, $Y_2O_3$, $Ta_2O_3$, and $TiO_2$. The use of the ALD method can prepare a thin film with a very high film density, and suppress damage during the process.

The film thickness of the first insulating protective film needs to correspond with an adequate thin film that can ensure the protection performance of the electromechanical transducer, and at the same time, needs to be as thin as possible so as not to hinder the displacement of the base film, and the film thickness is preferably 20 nm to 100 nm. If the film thickness is less than 20 nm, the insufficient function as a protective layer for the electromechanical transducer may then degrade the performance of the electromechanical transducer. If the film thickness is larger than 100 nm, the decreased displacement of the base film may then result in a liquid discharge head with a low discharging efficiency.

<Second Insulating Protective Film>

The function as the second insulating protective film is a passivation layer that has the function of a protective layer for individual electrode wiring and common electrode wiring. The second insulating protective film covers the individual electrode and the common electrode, excluding an individual electrode leading part and a common electrode leading part. Thus, inexpensive Al or an alloy material containing Al as a main constituent can be used for the electrode material. As a result, a liquid discharge head with low cost and high reliability can be provided.

As the material, known inorganic materials and organic materials can be used, but it is necessary to adopt a material with low moisture permeability. The inorganic materials include oxides, nitrides, and carbides, and the organic materials include polyimide, acrylic resins, and urethane resins.

However, in the case of the organic materials, it is necessary to increase the film thickness, which is not suitable for patterning. Therefore, it is preferable to adopt an inorganic material that can achieve, as a thin film, a wiring protection function. In particular, it is preferable to use $Si_3N_4$ on the Al wiring, as a technique that has been proven in semiconductor devices.

The film thickness is preferably 200 nm or more, and more preferably 500 nm or more. If the thickness is less than 200 nm, insufficient passivation function can be achieved, and disconnection due to corrosion of the wiring material may be caused, to decrease the reliability of liquid discharge.

Preferred is a structure with openings on the electromechanical transducer and the base film around the electromechanical transducer. This is because of the same reason as for reducing the thickness of the individual liquid chamber region for the first insulating protective film. This structure makes it possible to provide a liquid discharge head with high efficiency and high reliability.

In the formation of the openings, a photolithography method or a dry etching can be used, because the electromechanical transducer is protected with the first insulating protective film and second insulating protective film.

<Polarization Treatment>

Figure 7:
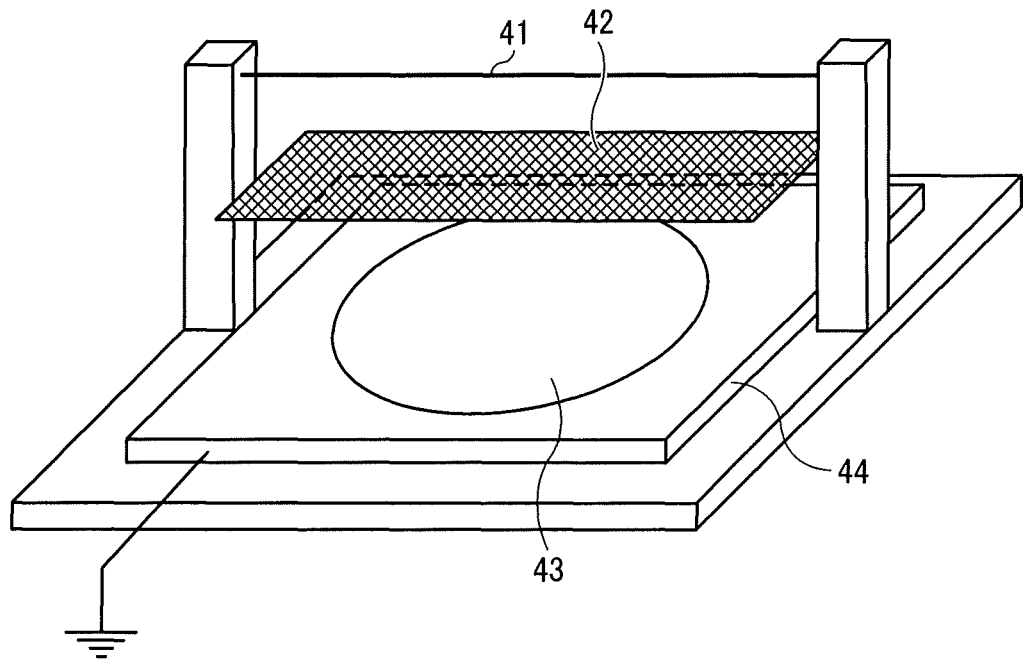
FIG. 7 is a perspective view illustrating an example of a polarization treatment device.
Figure 8:
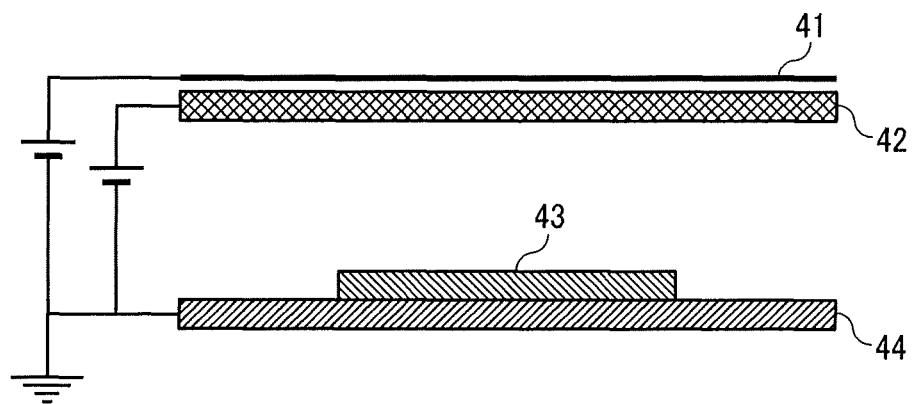
FIG. 8 is a cross-sectional view illustrating the example of the polarization treatment device.

The electromechanical transducer is subjected to a polarization treatment with the use of, for example, a polarization treatment device shown in FIGS. 7 and 8. FIG. 7 is a perspective view of the polarization treatment device according to the present embodiment, and FIG. 8 is a cross-sectional view of the polarization treatment device. As a device configuration, a corona electrode 41 and a grid electrode 42 are provided, with, for example, a temperature control function added to a stage 44 for setting a sample so that the wafer 43 can be subjected to a polarization treatment while raising a temperature up to a maximum temperature of 350° C.

In this regard, the stage 44 is earthed, and in the case without earthing, no polarization treatment can be achieved.

The grid electrode 42 has a mesh shape, which is devised so that the underlying sample stage is showered efficiently with ions, charges, and the like generated by corona discharge when a high voltage is applied to the corona electrode 41. The adjustment of the voltages applied to the corona electrode 41 and the grid electrode 42 or the distance between the sample and each electrode makes it possible to make corona discharge stronger or weaker.

Figure 9:
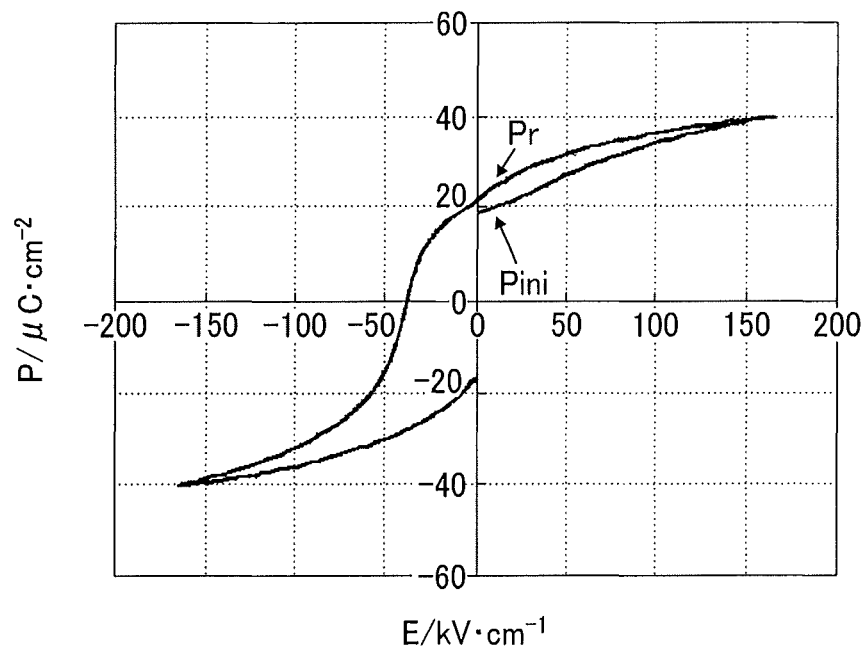
FIG. 9 is a graph showing an example of a hysteresis loop for explaining a polarization state.

In this regard, the state of polarization treatment can be determined from the P-E hysteresis loop. As shown in FIG. 9, the hysteresis loop is measured with an electric field intensity of ±150 kV/cm applied, and when the polarization at the first 0 kV/cm is denoted by Pini, whereas the polarization at 0 kV/cm is denoted by Pr in the case of after applying the voltage of +150 kV/cm, returning the voltage to 0 kV/cm, the value of Pr-Pini is defined as the polarizability, and the polarization state can be determined from this polarizability. In this regard, the polarizability Pr-Pini is preferably 10 $\mu C/cm^2$ or less, and more preferably 5 $\mu C/cm^2$ or less. If the polarizability is less than this value, an insufficient piezoelectric property may be obtained for displacement deterioration after continuous driving as a PZT piezoelectric actuator.

In order to obtain the desired polarizability Pr-Pini, the polarizability can be achieved by adjusting the corona and grid electrode voltages, the distances between the sample stage and the corona and grid electrode, or the like in the polarization treatment device.

<Embodiment of Liquid Discharge Head and Liquid Discharge Apparatus>

Figure 10:
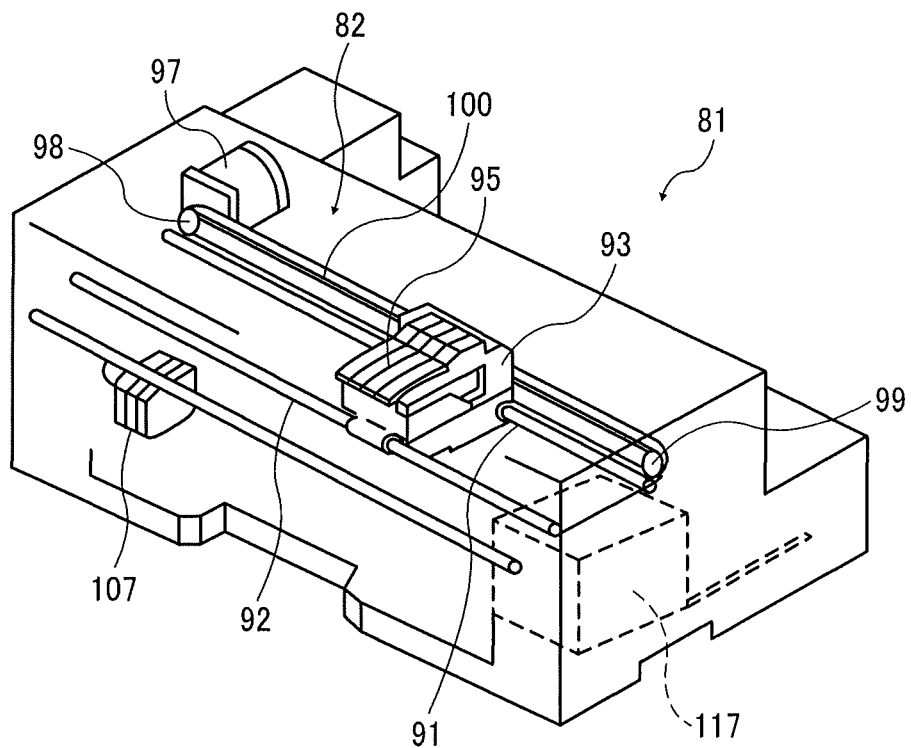
FIG. 10 is a perspective view illustrating an example of a liquid discharge apparatus.
Figure 11:
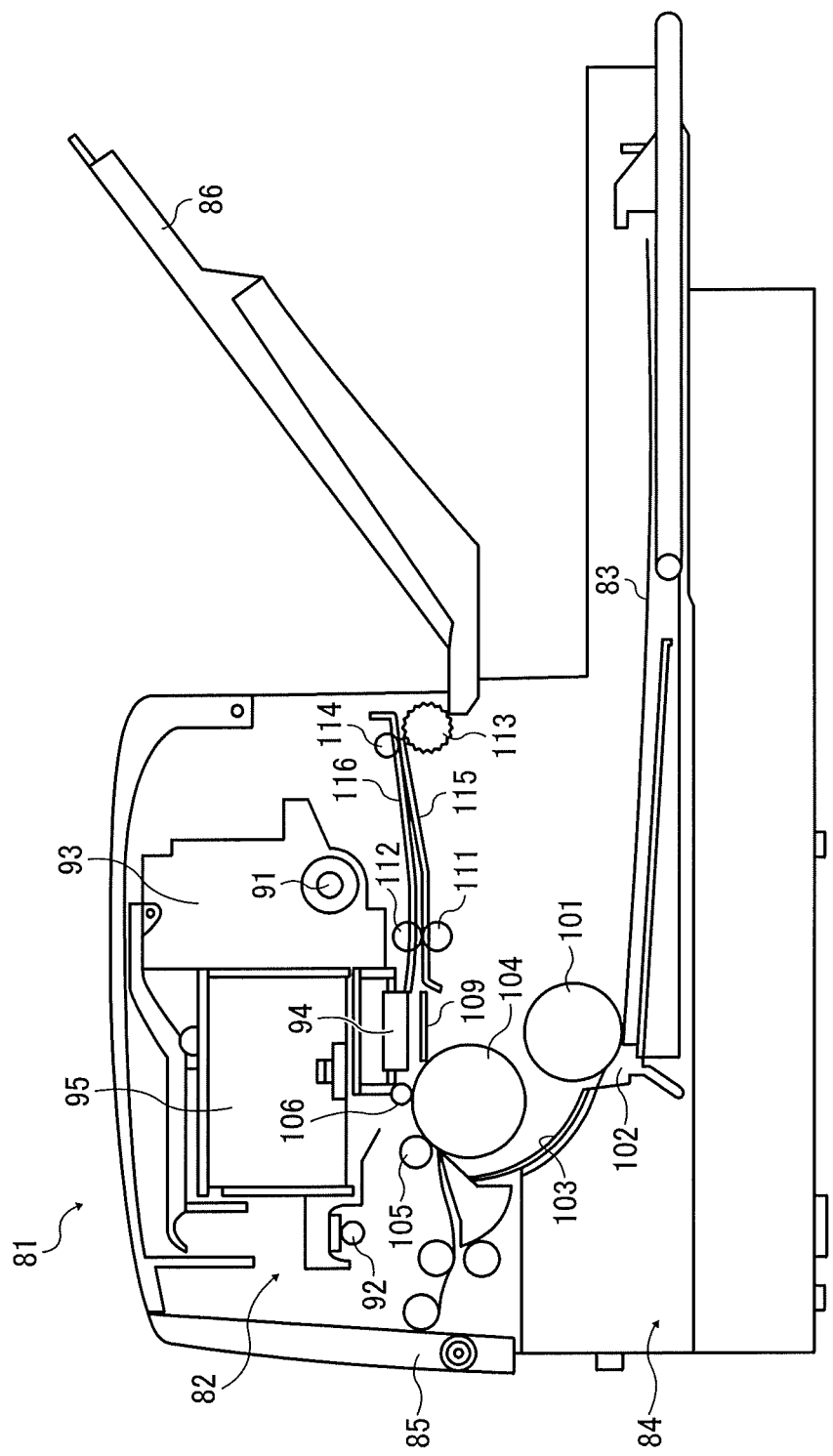
FIG. 11 is a side view illustrating an example of the liquid discharge apparatus.

Next, an example of a liquid discharge apparatus mounted with a liquid discharge head according to an embodiment of the present disclosure will be described with reference to FIGS. 10 and 11. It is to be noted that FIG. 10 is a perspective explanatory view of the recording apparatus, and FIG. 11 is a side explanatory view of a mechanism unit of the recording apparatus.

An example of an inkjet recording apparatus will be given and described herein as a liquid discharge apparatus. This inkjet recording apparatus includes a carriage that is movable in the main scanning direction inside a recording apparatus main body 81, a recording head mounted on the carriage, which is made of an inkjet head according to the present embodiment, and a printing mechanism unit 82 including an ink cartridge that supplies an ink to the recording head, and the like. A sheet feeding cassette (which may be a sheet feeding tray) 84 capable of stacking a large number of sheets 83 from the front side can be freely inserted and pulled in the lower section of the apparatus main body 81. In addition, a manual sheet feeding unit 85 for manually feeding the sheets 83 can be opened, and the sheets 83 fed from the sheet feeding cassette 84 or the manual sheet feeding unit 85 are taken in, and after recording the required image by the printing mechanism unit 82, ejected to a sheet ejection unit 86 mounted on the rear side.

The printing mechanism unit 82 holds a carriage 93 so as to be slidable in the main scanning direction, with a main guide rod 91 and a sub-guide rod 92 which are guide members laterally bridging the left and right side plates. This carriage 93 is mounted with heads 94 made of inkjet heads that discharge ink droplets in respective colors of yellow (Y), cyan (C), magenta (M), and black (Bk), with a plurality of ink discharge outlets (nozzles) arranged in a direction intersecting with the main scanning direction, and with the ink droplet discharging direction facing downward.

In addition, the carriage 93 is replaceably mounted with each ink cartridge 95 for supplying an ink of each color to the head 94. The ink cartridge 95 has an atmosphere port communicated with the atmosphere at the upper side, a supply port for supplying an ink to the inkjet head at the lower side, and a porous body filled with an ink inside, and the capillary force of the porous body keeps the ink supplied to the inkjet head at a slightly negative pressure. Although the head 94 for each color is used herein as the recording head, a single head with nozzles for discharging ink droplets for each color may be adopted.

In this regard, the carriage 93 is slidably fitted into the main guide rod 91 on the rear side (the downstream side in the sheet conveyance direction), and the front side (the upstream side in the sheet conveyance direction) is slidably placed on the sub-guide rod 92. In order to move and scan with the carriage 93 in the main scanning direction, a timing belt 100 is stretched between a driving pulley 98 and a driven pulley 99 which are rotationally driven by a main scanning motor 97, and the timing belt 100 is fixed to a carriage 93, and the carriage 93 is driven to reciprocate by forward/reverse rotation of the main scanning motor 97.

On the other hand, a sheet feeding roller 101 and a friction pad 102 for separating and feeding the sheets 83 from the sheet feeding cassette 84, a guide member 103 for guiding the sheets 83, a conveying roller 104 for reversing and conveying the fed sheets 83, a conveying roller 105 pressed against the circumferential surface of the conveying roller 104, and a leading end roller 106 for defining the feeding angle of the sheets 83 from the conveying roller 104 are provided in order to convey the sheets 83 set in the sheet feeding cassette 84 to the lower side of the head 94. The conveying roller 104 is rotationally driven by a sub-scanning motor 107 via a gear train.

An image receiving member 109 which serves as a sheet guiding member for guiding the sheets 83 fed from the conveying roller 104 on the lower side of the recording head 94 is provided to correspond to the moving range of the carriage 93 in the main scanning direction. On the downstream side of the image receiving member 109 in the sheet conveyance direction, a conveying roller 111 and a spur roller 112 are provided which are rotationally driven to feed the sheets 83 in the sheet ejection direction, and furthermore, a sheet ejection roller 113 and a spur roller 114 for feeding the sheets 83 to the sheet ejection unit 86, and guide members 115 and 116 which form a sheet ejection path are disposed.

For recording, driving the recording head 94 in response to image signals while moving the carriage 93 discharges the ink onto the stopped sheet 83 to record one line, and then record the next line after conveying the sheet 83 by a predetermined amount. Upon receiving a recording completion signal or a signal indicating that the rear end of the sheet 83 has reached the recording area, the recording operation is completed, and the sheet 83 is ejected.

In addition, a recovery device 117 for recovery from a discharge failure of the head 94 is disposed in a position outside the recording area on the right-end side in the moving direction of the carriage 93. The recovery device 117 has a cap means, a suction means, and a cleaning means. The carriage 93 is moved toward the recovery device 117 on printing standby, and the head 94 is capped with the capping means to keep the discharge outlet part wet, thereby preventing discharge failures due to ink drying. In addition, discharging the ink unrelated to recording in the course of recording or the like keeps the ink viscosity constant at all of the discharge outlets, to maintain stable discharging performance.

If any discharge failure occurs, the discharge outlet (nozzle) of the head 94 is hermetically sealed with the capping means, bubbles and the like are sucked out together with the ink from the discharge outlet by the suction means through a tube, and the ink, dust, and the like attached to the discharge outlet surface are removed by the cleaning means, to achieve recovery from the discharge failure. In addition, the sucked ink is discharged to a waste ink reservoir installed in the lower portion of the main body, and absorbed and held in an ink absorber inside the waste ink reservoir.

As just described, the liquid discharge head and the liquid discharge apparatus according to the present embodiment include the electromechanical transducer according to one embodiment of the present disclosure, and thus have favorable piezoelectric properties and withstand voltages, with the occurrence of fewer failures. In addition, the head and the apparatus are capable of preventing ink droplets from being discharged defectively due to defective diaphragm driving, and also suppressing the variation in displacement, thus providing stable ink droplet discharging characteristics, and improving the image quality.

EXAMPLES

Hereinafter, one embodiment of the present disclosure will be described in more detail with reference to examples, but embodiments of the present disclosure are not to be considered limited to the following examples.

Example 1

Prepared was a diaphragm where $SiO_2$ (film thickness: 600 nm), Si (film thickness: 200 nm), $SiO_2$ (film thickness: 100 nm), SiN (film thickness: 150 nm), $SiO_2$ (film thickness: 130 nm), SiN (150 nm), $SiO_2$ (film thickness: 100 nm), Si (200 nm), and $SiO_2$ (film thickness: 600 nm) were formed in this order on a 6-inch silicon wafer. Then, titanium films (film thickness: 20 nm) were formed as a first electrode and a second electrode in a sputtering apparatus at a film formation temperature of 350° C., and then thermally oxidized at 750° C. through the use of RTA (rapid thermal processing), and subsequently, a platinum film (film thickness: 160 nm) was formed in a sputtering apparatus at a film formation temperature of 400° C.

Next, as a $PbTiO_3$ layer to serve as a base layer, a film of a solution adjusted to Pb:Ti=1:1 was formed by spin coating, and dried at 120° C. to form a seed layer of 7 nm in film thickness.

Solutions respectively adjusted to:
Pb:Zr:Ti=115:58:42 of the precursor solution 1;
Pb:Zr:Ti=115:53:47 of the precursor solution 2; and
Pb:Zr:Ti=115:48:52 of the precursor solution 3,
were prepared as PZT precursor solutions 1, 2, and 3 as electromechanical transducer films.

For the synthesis of specific precursor coating liquids, lead acetate trihydrate, titanium isopropoxide, and zirconium isopropoxide were used as starting materials. The crystal water of lead acetate was dissolved in methoxyethanol, and then dehydrated. The amount of lead is excessive with respect to the stoichiometric composition. This is for preventing deterioration of crystallinity due to so-called lead missing during heat treatment. Isopropoxide titanium and isopropoxide zirconium were dissolved in methoxyethanol to develop an alcohol exchange reaction and an esterification reaction, and mixed with the previously mentioned methoxyethanol solution of the lead acetate dissolved therein, to synthesize PZT precursor solutions. The PZT concentration was adjusted to 0.5 mol/l.

The precursor solution 1 was applied by spin coating onto the $PbTiO_3$ layer formed in the way mentioned above, dried at 120° C., and thermally decomposed at 380° C. to form a film of a first layer. Subsequently, the precursor solution 2 was applied by spin coating, dried at 120° C., and thermally decomposed at 380° C. to form a film of second layer. Subsequently, the precursor solution 3 for PZT was applied by spin coating, dried at 120° C., and thermally decomposed at 380° C. to form a film of a third layer. The third layer was subjected to the thermal decomposition treatment, and then, to a crystallization heat treatment (temperature: 700° C.) by RTA (rapid thermal processing). The film thickness in this case was 240 nm. This process was carried out 8 times (24 layers) in total to provide an electromechanical transducer film of about 2 µm.

Next, as a third electrode and a fourth electrode, an $SrRuO_3$ film (film thickness: 40 nm) as an oxide film and a Pt film (film thickness: 125 nm) as a metal film were formed by sputtering. Then, a film of photoresist (TSMR 8800) manufactured by TOKYO OHKA KOGYO CO., LTD. was formed by a spin coating method, a resist pattern was formed by common photolithography, and such a pattern as shown in FIGS. 2A and 2B was then formed with the use of an ICP etching apparatus (manufactured by Samco Corporation).

Next, as a first insulating protective film, an $Al_2O_3$ film of 50 nm was formed by using the ALD method. In this regard, film formation was progressed by alternately laminating, as raw materials, TMA (Sigma-Aldrich) for Al and $O_3$ generated by an ozone generator for O.

Then, as shown in FIGS. 2A and 2B, contact holes are formed by etching. In addition, as a fifth electrode, a sixth electrode, and a metal wiring, an Al—Cu film was formed by sputtering, and subjected to patterning by etching. Next, as a second insulating protective film, a $Si_3N_4$ film of 500 nm was formed by plasma CVD.

In this way, electromechanical transducers were fabricated. Electromechanical transducers were laid out to arrange a row of 300 pieces in a single chip.

In addition, a joint surface step for joining a holding substrate is formed in accordance with a similar process. The joint surface step is provided in a position corresponding to the partition wall of the pressurizing chamber. In the step of forming the first insulating protective film, the same layers as the respective layers of the insulating film, the metal wiring, and the second insulating protective film are formed in a position corresponding to the partition wall of the pressurizing chamber. More specifically, the junction surface step includes a laminate of the same layer as the first insulating film, the same layer as the metal wiring, and the same layer as the second insulating protective film. In addition, this junction surface step is not provided in the active part of the electromechanical transducer, and not provided outside the partition wall part of the pressurized liquid chamber, but formed in a position that has no influence on the region where the diaphragm is deformed.

Then, a polarization treatment was carried out by corona charging treatment with the use of the polarization treatment device shown in FIGS. 7 and 8. For the corona charging treatment, wires of tungsten with a diameter of 50 µm were used, and a grid electrode made of stainless steel with an aperture ratio of 60% was used as the grid electrode. The polarization treatment was carried out, as polarization treatment conditions, under the conditions of treatment temperature: 80° C., corona voltage: 9 kV, grid voltage: 1.5 kV, treatment time: 30 s, corona electrode-grid electrode distance: 4 mm, and grid electrode-stage distance: 4 mm.

Next, a common electrode PAD and individual electrode PADs were formed for coupling to the fifth electrode and the sixth electrode. The distance between the individual electrode PADs was adjusted to 80 µm.

Then, as shown in FIG. 4A, Si of the back surface was etched to fabricate an electromechanical transducer with a pressurizing chamber (width: 60 µm) formed. In this regard, in order to hold the pressurizing chamber, Si etching was carried out from the back surface of the wafer after joining the holding substrate. The width of the opening of the holding substrate covering the electromechanical transducer was adjusted to 75 µm.

Then, such a liquid discharge head as shown in FIG. 4A was fabricated with the use of the electromechanical transducer fabricated.

Example 2

Except for the preparation of solutions adjusted to: Pb:Zr:Ti=110:58:42 of the precursor solution 1;
Pb:Zr:Ti=110:53:47 of the precursor solution 2; and
Pb:Zr:Ti=110:48:52 of the precursor solution 3,
respectively as PZT precursor solutions 1, 2, and 3, and the use of the PZT precursor solutions 1, 2, and 3, Example 2 was given in the same way as in Example 1.

Example 3

Except for the preparation of solutions adjusted to:
Pb:Zr:Ti=110:58:42 of the precursor solution 1;
Pb:Zr:Ti=110:53:47 of the precursor solution 2; and
Pb:Zr:Ti=120:48:52 of the precursor solution 3, respectively as PZT precursor solutions 1, 2, and 3, and the use of the PZT precursor solutions 1, 2, and 3, Example 3 was given in the same way as in Example 1.

Example 4

Except for the preparation of solutions adjusted to:
Pb:Zr:Ti=115:63:37 of the precursor solution 1;
Pb:Zr:Ti=115:53:47 of the precursor solution 2; and
Pb:Zr:Ti=115:43:57 of the precursor solution 3,
respectively as PZT precursor solutions 1, 2 and 3, and the use of the PZT precursor solutions 1, 2 and 3, Example 4 was given in the same way as in Example 1.

Example 5

Except for the preparation of solutions adjusted to:
Pb:Zr:Ti=115:68:32 of the precursor solution 1;
Pb:Zr:Ti=115:63:37 of the precursor solution 2; and
Pb:Zr:Ti=115:58:42 of the precursor solution 3,
respectively as PZT precursor solutions 1, 2, and 3, and the use of the PZT precursor solutions 1, 2, and 3, Example 5 was given in the same way as in Example 1.

Example 6

Except for the preparation of solutions adjusted to:
Pb:Zr:Ti=115:48:52 of the precursor solution 1;
Pb:Zr:Ti=115:43:57 of the precursor solution 2; and
Pb:Zr:Ti=115:38:62 of the precursor solution 3,
respectively as PZT precursor solutions 1, 2, and 3, and the use of the PZT precursor solutions 1, 2, and 3, Example 6 was given in the same way as in Example 1.

Comparative Example 1

Except for the preparation of a solution adjusted to Pb, Zr, Ti=115:53:47 as a PZT precursor solution, and the use of the PZT precursor solution, Comparative Example 1 was given in the same way as in Example 1. In detail, the process was repeated 8 times where the step of applying the above-mentioned PZT precursor solution by spin coating, followed by drying at 120° C., and thermal decomposition at 380° C. was repeated 3 times, and a crystallization heat treatment (temperature: 700° C.) was then carried out. The film thickness of the obtained PZT was the same as in Example 1.

Comparative Example 2

Except for the preparation of a solution adjusted to Pb, Zr, Ti=110:53:47 as a PZT precursor solution, and the use of the PZT precursor solution, Comparative Example 1 was given in the same way as in Comparative Example 1.

Comparative Example 3

Except for the preparation of solutions adjusted to:
Pb:Zr:Ti=125:58:42 of the precursor solution 1;
Pb:Zr:Ti=125:53:47 of the precursor solution 2; and
Pb:Zr:Ti=125:48:52 of the precursor solution 3,
respectively as PZT precursor solutions 1, 2, and 3, and the use of the PZT precursor solutions 1, 2, and 3, Comparative Example 3 was given in the same way as in Example 1.

Comparative Example 4

Except for the preparation of solutions adjusted to:
Pb:Zr:Ti=115:68:32 of the precursor solution 1;
Pb:Zr:Ti=115:53:47 of the precursor solution 1; and
Pb:Zr:Ti=115:38:62 of the precursor solution 1,
respectively as PZT precursor solutions 1, 2, and 3, and the use of the PZT precursor solutions 1, 2, and 3, Comparative Example 4 was given in the same way as in Example 1.

(Measurement and Evaluation)
<Composition Ratio>

For the electromechanical transducers fabricated according to Examples 1 to 6 and Comparative Examples 1 to 4, the composition analysis of PZT in the film thickness direction was made with the use of inductively coupled plasma (ICP) emission spectroscopy and transmission electron microscopy—energy dispersive X-ray spectroscopy (TEM-EDS). The composition ratio was calculated, with the sum of Zr and Ti regarded as 100%. FIG. 5 shows measurement results of TEM-EDS for Example 1.

<Evaluation of Piezoelectric Constant d31>

Regarding the piezoelectric constant d31, the amount of displacement at an electric field intensity of 150 kV/cm was measured with a laser Doppler vibrometer, and based on the obtained amount of displacement, the piezoelectric constant d31 was calculated by a simulation.

The piezoelectric constant d31 of −140 μm/V or less was regarded as an acceptable level. The piezoelectric constant d31 is preferably −150 μm/V or less.

<Evaluation of Withstand Voltage and Failure Occurrence Rate>

Regarding the withstand voltage, from the viewpoint of time zero dielectric breakdown (TZDV, voltage breakdown of insulating film), the breakdown voltage was evaluated from 0V to 200V from the leakage current evaluation at a step voltage of 1V, and from the viewpoint of TDDB (temporal breakdown of insulating film), the failure occurrence rate was evaluated in the case of driving for $1 \times 10^6$ seconds at a DC voltage of 50V.

The withstand voltage of 150V or higher was regarded as an acceptable level.

The failure occurrence rate of 0.5% or less was regarded as acceptable level.

These evaluation results are shown in Table 1.

TABLE 1

| | Precursor Solution 1 | | | Precursor Solution 2 | | | Precursor Solution 3 | | | Variable Value | | Average Value | | Piezoelectric Constant | Withstand Voltage | Failure Occurrence Rate |
|---|---|---|---|---|---|---|---|---|---|---|---|---|---|---|---|---|
| | Pb | Zr | Ti | Pb | Zr | Ti | Pb | Zr | Ti | ΔPb [%] | ΔZr [%] | Pb(ave) [%] | Zr(ave) [%] | [pm/V] | [V] | [%] |
| Example 1 | 115 | 58 | 42 | 115 | 53 | 47 | 115 | 48 | 52 | 4.8 | 7.8 | 108.2 | 53.2 | −153 | 159 | 0% |
| Example 2 | 110 | 58 | 42 | 110 | 53 | 47 | 110 | 48 | 52 | 4.1 | 5.2 | 104.7 | 53.1 | −157 | 181 | 0% |
| Example 3 | 110 | 58 | 42 | 110 | 53 | 47 | 120 | 48 | 52 | 4.5 | 7.6 | 107.9 | 53.2 | −153 | 168 | 0% |
| Example 4 | 115 | 63 | 37 | 115 | 53 | 47 | 115 | 43 | 57 | 4.8 | 8.8 | 108.7 | 53.4 | −148 | 152 | 0% |
| Example 5 | 115 | 68 | 32 | 115 | 63 | 37 | 115 | 58 | 42 | 5.7 | 8.9 | 108.3 | 63.3 | −142 | 191 | 0% |

TABLE 1-continued

| | Precursor Solution 1 | | | Precursor Solution 2 | | | Precursor Solution 3 | | | Variable Value | | Average Value | | Piezoelectric Constant | Withstand Voltage | Failure Occurrence Rate |
|---|---|---|---|---|---|---|---|---|---|---|---|---|---|---|---|---|
| | Pb | Zr | Ti | Pb | Zr | Ti | Pb | Zr | Ti | ΔPb [%] | ΔZr [%] | Pb(ave) [%] | Zr(ave) [%] | [pm/V] | [V] | [%] |
| Example 6 | 115 | 48 | 52 | 115 | 43 | 57 | 115 | 38 | 62 | 3.8 | 6.9 | 107.9 | 42.9 | −145 | 150 | 0% |
| Comparative Example 1 | | | | 115:53:47 | | | | | | 11.8 | 13.3 | 113.6 | 53.1 | −119 | 149 | 2.4% |
| Comparative Example 2 | | | | 110:53:47 | | | | | | 4.6 | 11.3 | 108.4 | 53.2 | −124 | 163 | 1.1% |
| Comparative Example 3 | 125 | 58 | 42 | 125 | 53 | 47 | 125 | 48 | 52 | 10.7 | 8.8 | 118.9 | 53.2 | −135 | 99 | 0.8% |
| Comparative Example 4 | 115 | 68 | 32 | 115 | 53 | 47 | 115 | 38 | 62 | 7.9 | 15.2 | 111.3 | 53.1 | −145 | 108 | 11.4% |

For Examples 1 to 6, the variable amount of Pb and the variable amount of Zr satisfy desired numerical values, and the average value of Pb and the average value of Zr also satisfy desired numerical values. The electromechanical transducers which have such characteristics have favorable electromechanical transduction characteristics and withstand voltages. In addition, there is no failure for the evaluation time. It is to be noted that according to Examples 1 to 6, the ratios by atomic weight of Pb, Zr, and Ti in the electromechanical transducer films varied periodically with respect to the film thickness direction, and the variation period was 240 nm.

On the other hand, Comparative Examples 1 to 4 fail to satisfy either or both of the variable amount of Pb and the variable amount of Zr. Further, the average value of Pb tends to be high under any of the conditions. The electromechanical transducers which have such characteristics have a small value for either the withstand voltage or the electromechanical transduction characteristics. In addition, even in Comparative Example 2 where the withstand voltage is sufficiently high, there is a failure occurrence, and the composition variation in the film thickness direction is considered to have an intrinsic factor that causes dielectric breakdown with time.

Numerous additional modifications and variations are possible in light of the above teachings. It is therefore to be understood that, within the scope of the above teachings, the present disclosure may be practiced otherwise than as specifically described herein. With some embodiments having thus been described, it will be obvious that the same may be varied in many ways. Such variations are not to be regarded as a departure from the scope of the present disclosure and appended claims, and all such modifications are intended to be included within the scope of the present disclosure and appended claims.

What is claimed is:

1. An electromechanical transducer comprising:
   an electromechanical transducer film of laminated layers including a perovskite-type complex oxide represented by a general formula of $ABO_3$; and
   a pair of electrodes opposed to each other with the electromechanical transducer film interposed between the pair of electrodes,
   wherein, in the general formula of $ABO_3$, A includes Pb and B includes Zr and Ti,
   wherein a variable ratio ΔPb of Pb, determined by Pb(max)−Pb(min), is 6% or less and a variable ratio ΔZr of Zr, determined by Zr(max)−Zr(min), is 9% or less,
   where an atomic weight ratio of Pb in the electromechanical transducer film is denoted by Pb/B, an atomic weight ratio of Zr in the electromechanical transducer film is denoted by Zr/B, a maximum value and a minimum value of the atomic weight ratio of Pb in a film thickness direction of the electromechanical transducer film are denoted by Pb(max) and Pb(min), respectively, and a maximum value and a minimum value of the atomic weight ratio of Zr in the film thickness direction of the electromechanical transducer film are denoted by Zr(max) and Zr(min), respectively.

2. The electromechanical transducer according to claim 1, wherein Zr(ave) is from 40% to 70%, where Zr(ave) represents an average value of the atomic weight ratio of Zr in the film thickness direction of the electromechanical transducer film.

3. The electromechanical transducer according to claim 1, wherein Pb(ave) is from 100% to 109%, where Pb(ave) represents an average value of the atomic weight ratio of Pb in the film thickness direction of the electromechanical transducer film.

4. The electromechanical transducer according to claim 1, wherein the atomic weight ratio of each of Pb, Zr, and Ti in the electromechanical transducer film periodically varies with respect to the film thickness direction of the electromechanical transducer film.

5. The electromechanical transducer according to claim 4, wherein a variation period of the atomic weight ratio of each of Pb, Zr, and Ti is from 100 nm to 400 nm.

6. The electromechanical transducer according to claim 1, wherein the electromechanical transducer film is from 1 μm to 10 μm in thickness.

7. The electromechanical transducer according to claim 1, wherein B includes one or more elements selected from Sn, Ni, Zn, Mg, Mn, and Nb.

8. A liquid discharge head comprising the electromechanical transducer according to claim 1.

9. A liquid discharge apparatus comprising the liquid discharge head according to claim 8.

10. A method for manufacturing an electromechanical transducer that includes:
    an electromechanical transducer film of laminated layers including a perovskite-type complex oxide represented by a general formula of $ABO_3$; and
    a pair of electrodes opposed to each other with the electromechanical transducer film interposed between the pair of electrodes,
    wherein, in the general formula of $ABO_3$, A includes Pb and B includes Zr and Ti, the method comprising:
- first applying and firing a first precursor solution including Pb, Zr, and Ti;
- second applying and firing a second precursor solution including Pb, Zr, and Ti;
- third applying and firing a third precursor solution including Pb, Zr, and Ti;
- sintering a film obtained by the first applying and firing, the second applying and firing, and the third applying and firing; and
- repeating the first applying and firing, the second applying and firing, the third applying and firing, and the sintering a predetermined number of times, to form an electromechanical transducer film,
- wherein in an order of the first precursor solution, the second precursor solution, and the third precursor solution, a concentration of Zr decreases and a concentration of Ti increases,
- wherein, when a concentration of Pb in a precursor solution is denoted by Pb/B, the concentration of Pb in each of the first precursor solution, the second precursor solution, and the third precursor solution is from 100% to 120%,
- wherein, when a concentration of Zr in a precursor solution is denoted by Zr/B, a ratio of the concentration of Zr between precursor solutions for adjacent films is 0.8 or more and less than 1.

* * * * *